United States Patent
Lin et al.

(10) Patent No.: US 7,902,266 B2
(45) Date of Patent: Mar. 8, 2011

(54) COMPOSITION OF ANTI-GLARE COATING

(75) Inventors: Sheng-Chin Lin, Kaohsiung (TW); Chi-Hung Lin, Kaohsiung (TW)

(73) Assignee: Taiflex Scientific Co., Ltd. (TW)

( * ) Notice: Subject to any disclaimer, the term of this patent is extended or adjusted under 35 U.S.C. 154(b) by 426 days.

(21) Appl. No.: 11/987,444

(22) Filed: Nov. 30, 2007

(65) Prior Publication Data

US 2009/0142583 A1 Jun. 4, 2009

(51) Int. Cl.
*C09D 4/00* (2006.01)
*C09D 4/02* (2006.01)
*C09D 5/33* (2006.01)

(52) U.S. Cl. ............. 522/42; 522/46; 522/173; 522/179; 522/183; 522/83; 522/96; 522/103; 522/107

(58) Field of Classification Search .................... 522/83, 522/103, 107, 96, 173, 179, 183, 42, 46
See application file for complete search history.

(56) References Cited

U.S. PATENT DOCUMENTS

| 7,149,032 | B2 * | 12/2006 | Ohishi et al. | 359/586 |
| 7,233,378 | B2 * | 6/2007 | Obayashi et al. | 349/137 |
| 7,471,360 | B2 * | 12/2008 | Murakami et al. | 349/117 |
| 2006/0057344 | A1 * | 3/2006 | Sakurai et al. | 428/212 |
| 2006/0153979 | A1 * | 7/2006 | Asakura et al. | 427/164 |
| 2006/0182901 | A1 * | 8/2006 | Takagi | 428/1.31 |
| 2006/0280882 | A1 * | 12/2006 | Oka et al. | 428/1.31 |
| 2006/0286395 | A1 * | 12/2006 | Goto et al. | 428/480 |

* cited by examiner

*Primary Examiner* — Susan W Berman
(74) *Attorney, Agent, or Firm* — Bacon & Thomas, PLLC

(57) ABSTRACT

A composition of an anti-glare coating has a resin, multiple particles and a dispersant. The resin is selected from the group consisting of thermosetting resin and light-curing resin. The particles have a dimension that is from about 30 nanometers (nm) to about 10 micrometers (μm). Because the dispersant stabilizes and keeps a separation distance between each two particles, the particles cannot aggregate in or precipitate out of the anti-glare coating. Thus, the anti-glare coating can be coated easily on the substrate and a surface of the anti-glare film is uniform to provide an improved anti-glare effect. Moreover, the dispersant allows adjustment of haze, gloss and distinctness of image of a substrate coated with the anti-glare coating.

5 Claims, 1 Drawing Sheet

COMPOSITION OF ANTI-GLARE COATING

BACKGROUND OF THE INVENTION

1. Field of Invention

The present invention relates to a composition of an anti-glare coating, and more particularly to an anti-glare coating that comprises dispersant to prevent particles from aggregating.

2. Description of the Related Art

A transparent substrate such as a screen of a cathode ray tube (CRT), a panel or a touch panel of a liquid crystal display (LCD), a palm digital assistant (PDA), panes of glass for architectures, etc. has a layer of anti-glare (AG) film on a surface of the transparent substrate to decrease or eliminate reflections on the substrate to make viewing clearer and more comfortable.

A conventional composition of an anti-glare coating comprises resin, diluent and multiple particles. The particles include organic particles and inorganic particles. The organic particles may comprise polystyrene (PS), polymethyl methacrylate (PMMA), melamine formaldehyde resin, benzoguanamine, etc. The inorganic particles may include silica (silicon oxide, $SiO_2$), aluminum oxide ($Al_2O_3$), calcium carbonate ($CaCO_3$), etc. When the anti-glare coating is spread over a substrate and is cured, an anti-glare film is formed and the particles provide the anti-glare film to have a rough surface to decrease reflections of the substrate.

However, van der walls force forces the organic particles to aggregate and hydrogen bond will be generated between the inorganic particles to lead the inorganic particles to aggregate before the anti-glare coating is cured. Therefore, each particle-aggregation is large, so that a surface of the anti-glare film will become unevenly rough or even result in stuck pixel. Additionally, once the particles aggregate, they are hard to separate, so the particle-aggregations will precipitate in the anti-glare coating. Consequently, the anti-glare coating is hard to be coated uniformly over the substrate.

In U.S. Pat. No. 3,679,451, the anti-glare coating comprises a mixture of at least two dispersed incompatible polymers to make the anti-glare coating homogeneously. Thus, the anti-glare coating can be spread uniformly over a substrate. However, the incompatible polymers are unstable when they are mixed. Thus, the anti-glare coating with incompatible polymers is preferred to be produced by a batch process and not by a continuous procedure, wherein the batch process costs more than the continuous procedure.

In U.S. Pat. No. 4,582,761, an anti-glare coating comprises an aqueous dispersion of polyvinyl acetate (PVA) resin and aqueous dispersion of acrylic resin to provide an irregular surface of the anti-glare coating. However, polyvinyl acetate resin and acrylic resin have poor hardness. Therefore, the anti-glare coating with polyvinyl acetate resin and acrylic resin cannot be used for panels while current panels require high hardness.

U.S. Pat. No. 6,074,741 mention that a Japanese patent (No. 105738/1989) discloses an anti-glare coating that has ultra-violet curing resin and a silica pigment. However, silica particles are also prone to aggregate that leads to a poor anti-glare effect.

To overcome the shortcomings, the present invention provides a composition of an anti-glare coating to mitigate or obviate the aforementioned issues.

SUMMARY OF THE INVENTION

The primary objective of the present invention is to provide a composition-of an anti-glare coating that comprises dispersant to prevent particles from aggregating and can be adjusted to provide different haze, gloss and distinctness of image (DOI) to a substrate.

To achieve the objective, the composition of the anti-glare coating in accordance with the present invention comprises a resin, multiple particles and a dispersant. The resin is selected from the group consisting of thermosetting resin and light-curing resin. The particles have a dimension that is from about 30 nanometers (nm) to about 10 micrometers ($\mu$m).

Because the dispersant allows the particles to stabilizes and keep a separation distance between each two particles, the particles cannot aggregate in or precipitate out of the anti-glare coating. Thus, the anti-glare coating can be coated easily on the substrate and a surface of the anti-glare film is uniform to provide an improved anti-glare effect. Moreover, the dispersant allows adjustment of haze, gloss and DOI of a substrate coated with the anti-glare coating.

Other objectives, advantages and novel features of the invention will become more apparent from the following detailed description when taken in conjunction with the accompanying drawings.

DETAILED DESCRIPTION OF THE INVENTION

Figure 1:
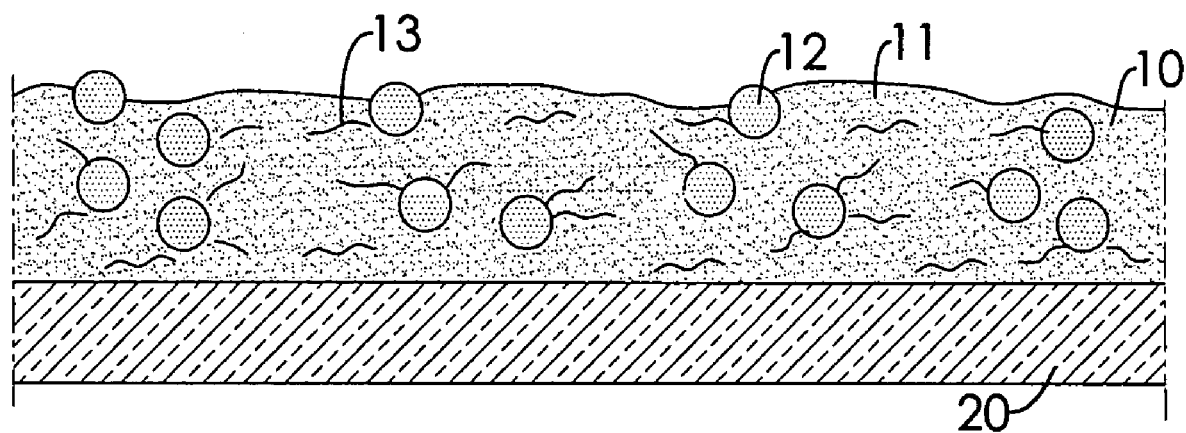
FIG. 1 is a side view in partial section of an anti-glare coating in accordance with the present invention on a substrate.

A composition of an anti-glare coating in accordance with the present invention has a total weight, resin, multiple particles, dispersant and a diluent.

The resin may be a thermosetting resin or a light-curing resin. Various thermosetting resins can be used, such as epoxy resin, phenolic resin, urea-formaldehyde resin or other thermosetting resins known by those ordinary skilled in the art.

The light-curing resin comprises a monomer, an oligomer and a photoinitiator. The monomer may be 2-phenoxy ethyl acrylate (PHEA), 1,6-hexanediol diacrylate (HDDA), trimethylolpropane triacrylate (TMPTA), dipentaerythritol hexaacrylate (DPHA) or a combination thereof. The oligomer may be urethane acrylate, epoxy acrylate, polyester acrylate or a combination thereof. The photoinitiator are initiators for free radical polymerization (such as IRGACURE 184 being a tradename for 1-Hydroxy-cyclohexyl-phenyl-ketone, produced by Ciba-Geigy, 2,2-dimethyl-2-hydroxyacetophenone (DAROCUR 1173, a tradename for 2,2-dimethyl-2-hydroxyacetophenone produced by Merck and Co.) and, 2'4-hydroxybenzophenone and benzophenone (BP).

The particles are mixed in the resin and have a total weight that is more than 0 wt % and less than about 50 wt % of the total weight of the anti-glare coating. A preferred total weight of the particles is more than 0 wt % and less than about 25 wt % of the total weight of the anti-glare coating. Each particle is between about 30 nanometers (nm) to about 10 micrometers ($\mu$m). The particles include organic particles and inorganic particles. The organic particles are polymers and may be polystyrene (PS), polymethyl methacrylate (PMMA), melamine formaldehyde resin, benzoguanamine, etc. The inorganic particles may be silicon dioxide ($SiO_2$), aluminum oxide ($Al_2O_3$), titanium dioxide ($TiO_2$), calcium carbonate ($CaCO_3$) or the like.

The dispersant is mixed in the resin and complexes with the particles to provide each particle with multiple long chains or an electrical double-layer, thereby allowing the particle to remain stable without aggregating due to steric stabilization or electrostatic stabilization.

The dispersant may be an aliphatic polycarboxylic acid, a fatty acid derivative, a fatty acid derivative amide salt, a fatty acid alkyl amine salt, a high molecular weight poly-ether ester amine salt, a high molecular weight polyester amine salt, a phosphate ester, an alkyleneglycol phosphate ester, a phosphate ester amine salt, a carboxylic acid amide salt or a combination thereof.

The dispersant has a weight that is more than 0 wt % and no more than about 50 wt % of the total weight of the particles. A preferred weight of the dispersant is more than 0 wt % and no more than about 25 wt % of the total weight of the particles.

Additionally, the weight of the dispersant can be adjusted to obtain a desired haze, gloss and distinctness of image (DOI).

The diluent is a polar solvent and may be iso-propyl alcohol (IPA), toluene, methyl-ethyl ketone, ethyl acetate, or the like.

With reference to FIG. 1, the anti-glare coating was added to a transparent substrate (20) and cured, for example using ultra violet curing to form a layer of anti-glare film (10). The substrate (20) is a long chain transparent material such as plastic or glass and is selected from the group consisting of polyethylene terephthalate (PET), triacetyl cellulose, polyimide, polyether, polycarbonate, polysulfone, polyethersulfone, cellophane, aromatic polyamide, polyethylene (PE), polypropylene (PP), polyvinyl alcohol and glass. The anti-glare film (10) comprises resin (11) and multiple particles (12). Each particle (12) complexes with the dispersant (13), so the particles (12) can be distributed uniformly in the resin (11).

Because the dispersant allows each particle to keep stable and enforces a separation between each two particles, the particles cannot aggregate in and precipitate out of the anti-glare coating. Therefore, the anti-glare coating can be coated easily on the substrate and a surface of the anti-glare film is uniformly rough to provide an improved anti-glare effect.

EXAMPLE

A liquid crystal display (LCD) panel automatically adjusts brightness as ambient light changes by adjusting a balance between reflected ambient light and emitted light from a backlight. When ambient light brightness is high, low backlight brightness is provided to the LCD panel, so the LCD panel requires an adequate haze to allow the LCD panel to reflect ambient light. When ambient brightness is low, high backlight brightness is provided to the LCD panel, so the LCD panel requires sufficient gloss and distinctness of image.

Following are examples of the anti-glare coating of the present invention when different kinds of, and different quantities of dispersant in the anti-glare film were added to a silica substrate. Haze, gloss and DOI of the silica substrate with the anti-glare film were then measured as well as and precipitation prevention of the anti-glare coating.

A method to measure the precipitation prevention in the anti-glare coating comprises pouring the anti-glare coating into a 100-ml graduated cylinder and measuring a volume of particles that is precipitated in a bottom of the graduated cylinder. A lower height of particles represents a better precipitation prevention substance.

Example 1

A composition of example 1 is shown as table 1, wherein the dispersant is high molecular weight poly-ether ester amine salt. Testing results of example 1 is shown as table 2.

TABLE 1

| | |
|---|---|
| Silica (Size = 1.5 μm) | 5 g |
| Dispersant (high molecular weight poly-ether ester amine salt) | 0/0.125/0.25/0.375 g |
| Resin (acrylic resin and TMPTA) | 100 g |
| Photoinitiator (DAROCUR 1173) | 4 g |
| Iso-propyl alcohol | 150 g |

(Solid content of the anti-glare coating is 40%.)

TABLE 2

| dispersant A (parts) | Haze | Gloss | DOI | Precipitation prevention (ml) |
|---|---|---|---|---|
| 0 | 18.2 | 60.6 | 21.9 | 13 |
| 0.125 | 14.3 | 84.6 | 69.8 | 10 |
| 0.25 | 10.7 | 121.3 | 135.5 | 6 |
| 0.375 | 9.3 | 125.6 | 146.2 | 5 |

Example 2

A composition of example 2 is shown as table 3, wherein the dispersant is amine salt with phosphate ester surfactant. A result of example 2 is shown as table 4.

TABLE 3

| | |
|---|---|
| Silica (Size = 2.3 μm) | 5 g |
| Dispersant (amine salt with phosphate ester surfactant) | 0/0.125/0.25/0.375 g |
| Resin (acrylic resin and PETTA) | 100 g |
| Photoinitiator (IRGACURE 184) | 4 g |
| Iso-propyl alcohol | 150 g |

(Solid content of the anti-glare coating is 40%.)

TABLE 4

| Dispersant B (parts) | Haze | Gloss | DOI | Precipitation Prevention (ml) |
|---|---|---|---|---|
| 0 | 15.3 | 104.7 | 153 | 13 |
| 0.125 | 13.8 | 122.4 | 201 | 5 |
| 0.25 | 14.4 | 123.3 | 207 | 1 |
| 0.375 | 14.8 | 120.6 | 236 | 0 |

According to these examples, the dispersant can prevent the particles from precipitating and adjust the haze, gloss and DOI. Therefore, manufacturers can conveniently alter a desired panel or glass by adjusting kinds or amount of dispersant used.

Even though numerous characteristics and advantages of the present invention have been set forth in the foregoing description, together with details of the composition and function of the invention, the disclosure is illustrative only. Changes may be made in detail, especially in matters of particle sizes and adding other additives within the principles of the invention to the full extent indicated by the broad general meaning of the terms in which the appended claims are expressed.

What is claimed is:
1. A composition of an anti-glare coating comprising:
  (i) light-curing resin having;
    a monomer being selected from the group consisting of 2-phenoxy ethyl acrylate (PHEA), 1,6-hexanediol diacrylate (HDDA), trimethylolpropane triacrylate (TMPTA), dipentaerythritol hexaacrylate (DPHA) and a combination thereof;

an oligomer being selected from the group consisting of urethane acrylate, epoxy acrylate, polyester acrylate and a combination thereof; and a photoinitiator being selected from the group consisting of initiators for free radical polymerization, 2,2-dimethyl-2-hydroxyacetophenone, 2,4-hydroxybenzophenone and benzophenone (BP);

(ii) particles having a dimension that is from 30 nanometer (nm) to 10 micrometer (μm) and having a weight that is more than 0 wt % and less than 50 wt % of the total weight of the anti-glare coating; and (iii) a dispersant having a weight that is more than 0 wt % and no more than 50 wt % of the weight of the particles.

2. The composition of an anti-glare coating as claimed in claim 1, wherein the weight of the particles is more than 0 wt % and less than about 25 wt % of the total weight of the anti-glare coating.

3. The composition of an anti-glare coating as claimed in claim 1, wherein the weight of the dispersant is more than 0 wt % and no more than about 25 wt % of the total weight of the particles.

4. The composition of an anti-glare coating as claimed in claim 1, wherein the dispersant is selected from a group consisting of aliphatic polycarboxylic acid, fatty acid derivative, fatty acid derivative amide salt, fatty acid alkyl amine salt, high molecular weight poly-ether ester amine salt, high molecular weight polyester amine salt, phosphate ester, alkyleneglycol phosphate ester, phosphate ester amine salt, carboxylic acid amide amine salt and a combination thereof.

5. The composition of an anti-glare coating as claimed in claim 1 further comprises a diluent that is selected from the group consisting of iso-propyl alcohol (IPA), toluene, methyl-ethyl ketone and ethyl acetate.

* * * * *